(12) United States Patent
Chen (10) Patent No.: US 10,527,898 B2
(45) Date of Patent: Jan. 7, 2020

(54) PIXEL STRUCTURE

(71) Applicants: HKC Corporation Limited, Shenzhen (CN); Chongqing HKC Optoelectronics Technology Co., ltd., Chongqing (CN)

(72) Inventor: Yu-Jen Chen, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/869,848

(22) Filed: Jan. 12, 2018

(65) Prior Publication Data

US 2018/0188624 A1    Jul. 5, 2018

Related U.S. Application Data (63) Continuation of application No. PCT/CN2017/106316, filed on Oct. 16, 2017.

(30) Foreign Application Priority Data

Dec. 30, 2016  (CN) .......................... 2016 1 1270668

(51) Int. Cl.
| | |
|---|---|
| *H01L 27/12* | (2006.01) |
| *G02F 1/1362* | (2006.01) |
| *G02F 1/1368* | (2006.01) |
| *G02F 1/1343* | (2006.01) |
| *G02F 1/136* | (2006.01) |

(52) U.S. Cl.
CPC ...... *G02F 1/136213* (2013.01); *G02F 1/1368* (2013.01); *H01L 27/124* (2013.01); *H01L 27/1255* (2013.01); *G02F 1/13439* (2013.01); *G02F 1/136286* (2013.01); *G02F 2001/13606* (2013.01)

(58) Field of Classification Search
CPC ............ G02F 1/136213; G02F 1/1368; G02F 2001/13606; G02F 1/13439; G02F 1/136286; H01L 27/0629; H01L 27/0676; H01L 27/0716; H01L 27/0722; H01L 27/0727; H01L 27/0733; H01L 27/0788; H01L 27/0794; H01L 27/1255; H01L 27/3265; H01L 27/124
See application file for complete search history.

(56) References Cited

U.S. PATENT DOCUMENTS

| | | | | |
|---|---|---|---|---|
| 5,943,106 A | * | 8/1999 | Sukenori | ........... G02F 1/136213 349/192 |
| 2005/0093805 A1 | * | 5/2005 | Hong | ................ G02F 1/134363 345/94 |

* cited by examiner

*Primary Examiner* — Cuong B Nguyen
(74) *Attorney, Agent, or Firm* — WPAT, PC (57) ABSTRACT

A pixel structure is provided. A pixel structure includes a pixel electrode, an active switch, a common line and an L-shaped conductive. The active switch is coupled to the pixel electrode. The common line is in conjunction with the pixel electrode to from a first storage capacitor. The L-shaped conductive wire is in conjunction with the pixel electrode to from a second storage capacitor.

12 Claims, 13 Drawing Sheets

PIXEL STRUCTURE

FIELD OF THE DISCLOSURE

The disclosure relates to a pixel structure field, and more particularly to improve pixel-to-pixel crosstalk of the pixel structure.

BACKGROUND

Currently, a lot of display devices (for example Liquid crystal display (LCD) or Electro Luminenscence (EL)) are widely applied to plane surface display with advanced technology. For example, most of the liquid crystal display device is back-light liquid crystal display device which composited by liquid crystal panel and backlight module. The liquid crystal panel is composited by liquid crystal molecules arranged between two transparent substrates.

The existing liquid crystal device usually respectively provides data signals by multiple pixel electrodes according to image information and controls transparency of multiple pixel units to display desired image. Specifically, each pixel structure is respectively coupled with data line and scan line, and scan line is coupled with pixel structure by Thin Film Transistor (TFT). The data line charging the pixel electrode according to switch-on TFT by scan line. However, parasitic capacitances will be produced during charging process and voltage of the pixel electrode will be shared by crosstalk. It cause insufficient voltage of pixel electrode and lead to abnormal coloration of display. Along with the higher resolution, the crosstalk more obviously.

SUMMARY

A technical problem to be solved by the disclosure is to provide a pixel structure for reducing pixel-to-pixel crosstalk.

An objective of the disclosure is achieved by following embodiments. In particular, a pixel structure includes a pixel electrode, an active switch, a common line and an L-shaped conductive wire. The active switch is coupled to the pixel electrode. The common line is in conjunction with the pixel electrode to from a first storage capacitor. The L-shaped conductive wire is in conjunction with the pixel electrode to from a second storage capacitor.

In an embodiment, an end of the first storage capacitor is coupled to the active switch, and another end of the first storage capacitor is coupled to the common line.

In an embodiment, an end of the first storage capacitor is coupled to the active switch, and another end of the first storage capacitor is coupled to one of the scan lines.

In an embodiment, the first storage capacitor and the second storage capacitor are formed by a first conducting layer, a second conducting layer and a third conducting layer, the first conducting layer is coupled to a drain of the active switch, the second conducting layer is coupled to a first voltage line, the L-shaped conductive wire is formed by the third conducting layer coupled to a second voltage line, and the first conducting layer, the second conducting layer and the third conducting layer are stacked interval, and the first conducting layer, the second conducting layer and the third conducting layer are overlapped to each other of the vertical space.

In an embodiment, the first voltage line comprises the common line.

In an embodiment, the second voltage line is overlap with the common line of the first conducting layer covering area.

In an embodiment, the first voltage line comprises upper scan line.

In an embodiment, at least one of the first conducting layer, the second conducting layer and the third conducting layer is made of transparent conductive material.

In an embodiment, the pixel structure further comprises a second L-shaped conductive wire overlapped on the first L-shaped conductive wire, and a insulating layer at positions corresponding to the first L-shaped conductive wire and the second L-shaped conductive wire for forming a third storage capacitor.

In an embodiment, the first conducting layer is corresponding to the second conducting layer and the third conducting layer, and the first storage capacitor is formed between the first conducting layer and the second conducting layer, and the second storage capacitor is formed between the first conducting layer and the third conducting layer.

In an embodiment, the second conducting layer is corresponding to the first conducting layer and the third conducting layer, and the first storage capacitor is formed between the first conducting layer and the second conducting layer, and the third storage capacitor is formed between the second conducting layer and the third conducting layer.

In an embodiment, the pixel electrode is made of transparent conductive material.

In an embodiment, the active switch is thin-film transistor, and at least one of the first conducting layer, the second conducting layer and the third conducting layer is made by same material of a first metal layer of the active switch.

In an embodiment, the active switch is thin-film transistor, and at least one of the first conducting layer, the second conducting layer and the third conducting layer is made by same material of a second metal layer of the active switch.

In an embodiment, the first conducting layer, the second conducting layer and the third conducting layer are made of conductive metal.

In an embodiment, the first conducting layer, the second conducting layer and the third conducting layer are parallel to each other.

According to another aspect of the disclosure, the disclosure further provides a pixel structure.

A pixel structure includes a pixel electrode, an active switch, a common line and an L-shaped conductive wire. The active switch coupled to the pixel electrode. The common line in conjunction with the pixel electrode to from a first storage capacitor. The L-shaped conductive wire in conjunction with the pixel electrode to from a second storage capacitor, and the L-shaped conductive wire comprise a first L-shaped conductive wire.

The first storage capacitor and the second storage capacitor are formed by a first conducting layer, a second conducting layer and a third conducting layer, the first conducting layer is coupled to a drain of the active switch, the second conducting layer is coupled to a first voltage line, the third conducting layer is coupled to a second voltage line, and the first conducting layer, the second conducting layer and the third conducting layer are stacked interval, and the first conducting layer, the second conducting layer and the third conducting layer are overlapped to each other of the vertical space.

The first voltage comprises the common line and upper scan line.

The pixel structure further comprises a second L-shaped conductive wire overlapped on the first L-shaped conductive wire, and a insulating layer at positions corresponding to the first L-shaped conductive wire and the second L-shaped conductive wire for forming a third storage capacitor.

Using L-shaped conducting wire to form at least two storage capacitors in pixel structure so that the storage capacitors could keep pixel voltage size of pixel structure at the same time for reducing affect of parasitic capacitances and improving crosstalk affect, and the display panel could be displayed properly.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

Charging time of each charging time unit is short so that for keeping the voltage Vpixel of the pixel structure providing an embodiment of the invention as shown in FIG. 1 to FIG. 8. Specifically, the pixel structure is respectively couple with a data line Data n and a scan line Gate n, the scan line is coupled with the pixel structure by an active switch (for example but not limited to thin film transistor, TFT). The data line Data n control and switch-on the active switch TFT for charging the pixel structure. The data line Data n charging a liquid crystal capacitor Clc and a storage capacitor Cst by the charging voltage Vdata during the charging process of the pixel structure. The pixel structure keeps the voltage Vpixel by the storage capacitor Cst so that the display panel could be displayed properly.

However, display panel will shows different grey level during display process. The charging voltage of pixel structure will keep changing from the data line Data n so that the voltage of the pixel structure is changed as follows. The charging voltage of the data line and pixel structure having multiple parasitic capacitances (Cpd-L、Cgd and Cpd-R) as shown in dotted line of FIG. 7 and FIG. 8. The capacitors between dotted lines are multiple parasitic capacitances. The multiple parasitic capacitances (Cpd-L、Cgd and Cpd-R) will crosstalk to each other and cause the voltage of the pixel electrode be shared. It cause insufficient voltage of pixel electrode and lead to abnormal coloration of display.

In order to reducing affect of parasitic capacitances and improving of crosstalk affect, the applicants provide following two solutions:

One solution is to dispose the data line away from the pixel structure for reducing affect of parasitic capacitances and crosstalk. But, it will increase flat space of the display panel and not easy to use for high resolution display panel.

Another solution is to increase storage capacitor Cst and make it bigger than parasitic capacitances (Cpd-L, Cgd and Cpd-R) for decreasing the effect of crosstalk. But, it needs to increase the size of conducting layer of the storage capacitor, which also increases flat space of the pixel structure. Along with the resolution is getting higher, the space for accommodated the pixel electrode is getting smaller and the space for accommodated the storage capacitor is also getting smaller. On the other hand, increasing storage capacitor is not easily used for high resolution display panel, the space for accommodated the storage capacitor is limited by flat space so that the improvement of crosstalk be decreased.

Therefore, applicants provide another solution for solve the problem described above.

The disclosure will be further described in detail with reference to accompanying drawings shown in FIG. 9 to FIG. 16 and preferred embodiments as follows.

Please refer to the FIG. 9 to FIG. 16. A pixel structure and a pixel circuit are disclosed in this embodiment of the invention. In this embodiment, the pixel structure and the pixel circuit could be different types, and each type could be use to different display devices. For example, the pixel structure of the invention could be applied to the following different display devices such as Twisted Nematic (TN), Super Twisted Nematic (STN), In-Plane Switching (IPS), Vertical Alignment (VA), High Vertical Alignment (HVA) or curved display panel.

Figure 1:
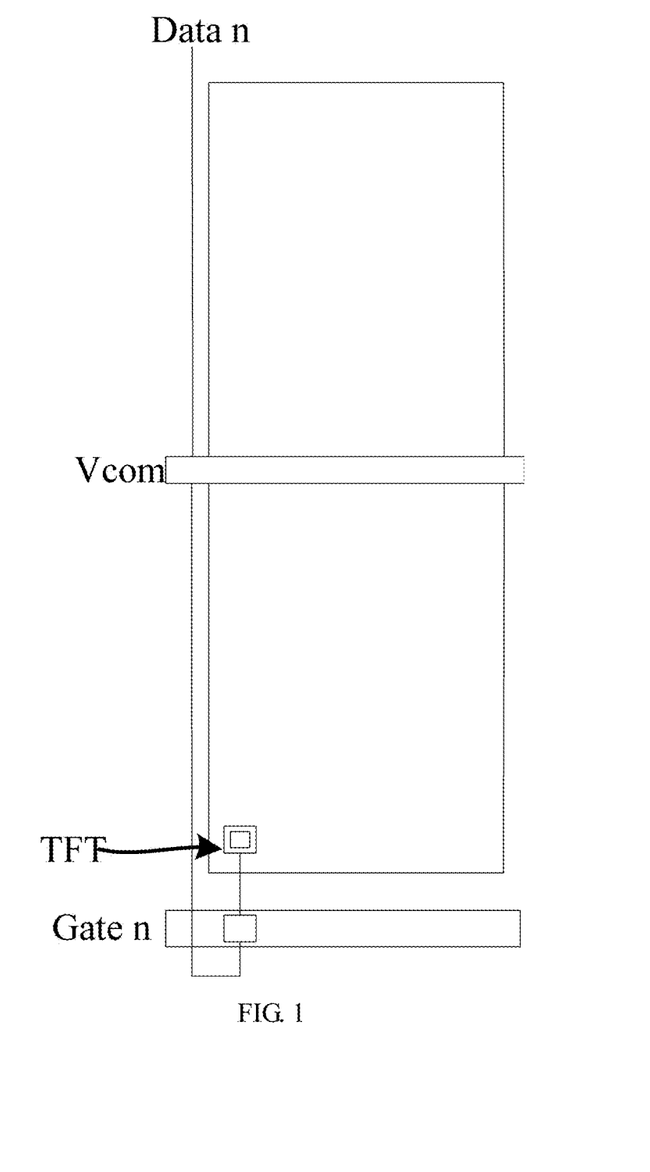
FIG. 1 is a structural schematic view of a pixel structure of the disclosure.
Figure 2:
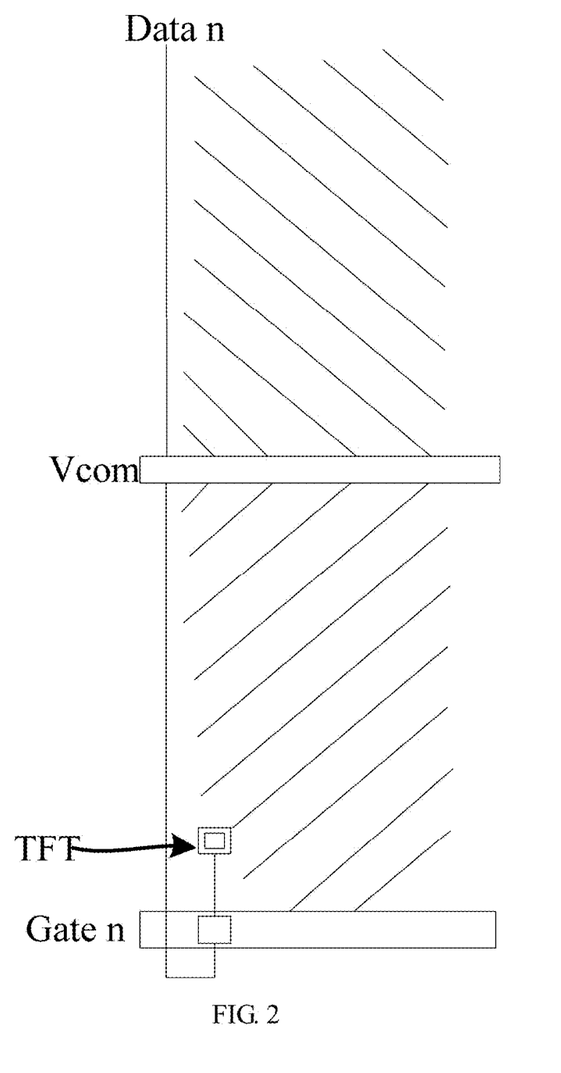
FIG. 2 is a structural schematic view of a pixel structure of the disclosure.
Figure 3:
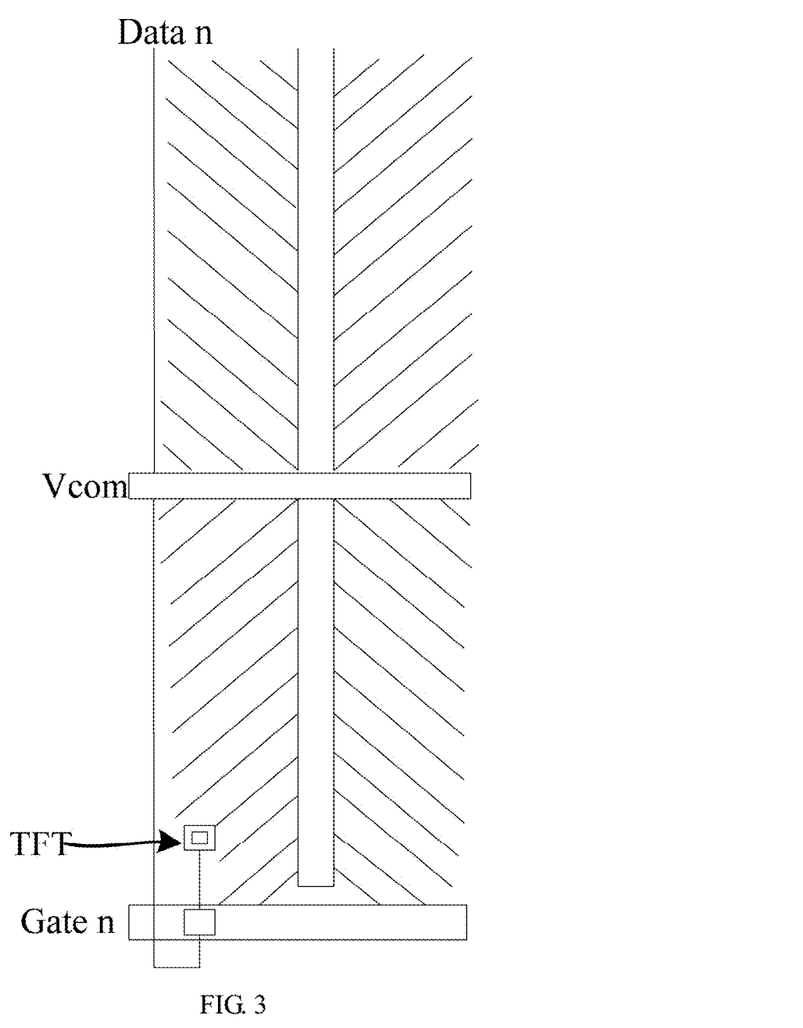
FIG. 3 is a structural schematic view of a pixel structure of the disclosure.
Figure 4:
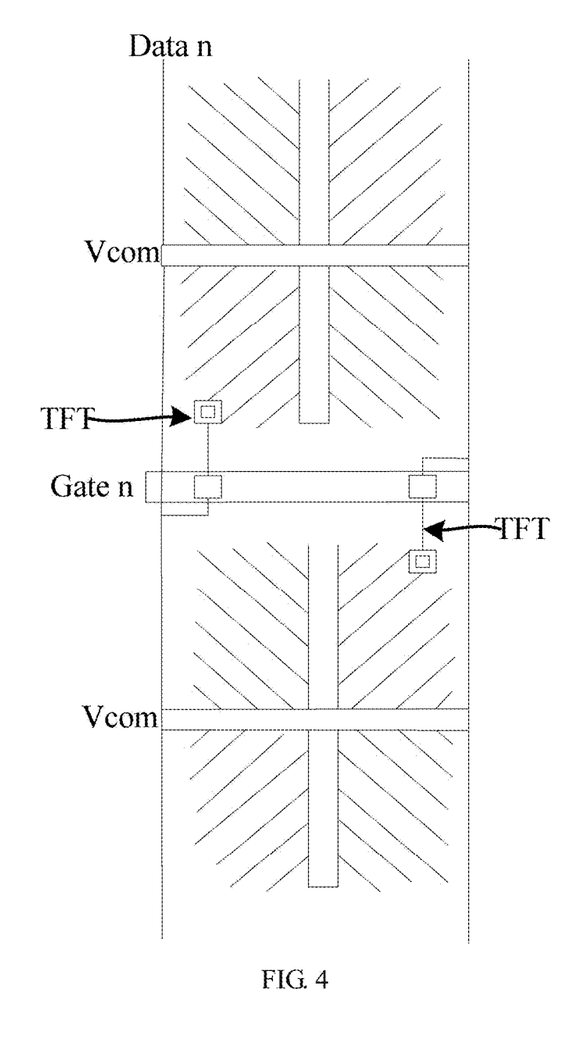
FIG. 4 is a structural schematic view of a pixel structure of the disclosure.
Figure 5:
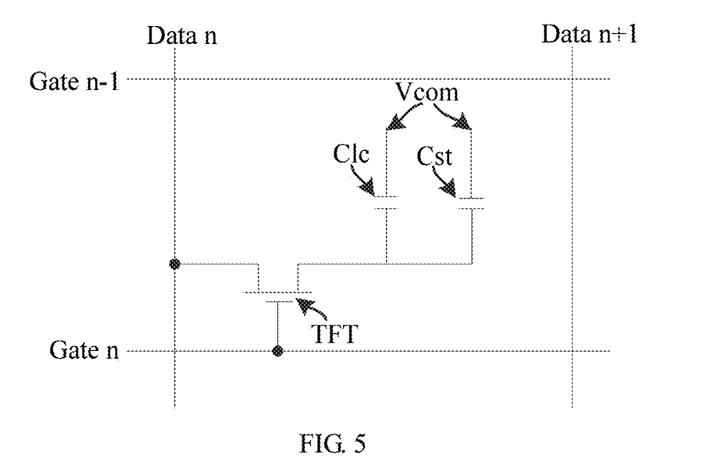
FIG. 5 is a circuit schematic view of a pixel structure of the disclosure.
Figure 6:
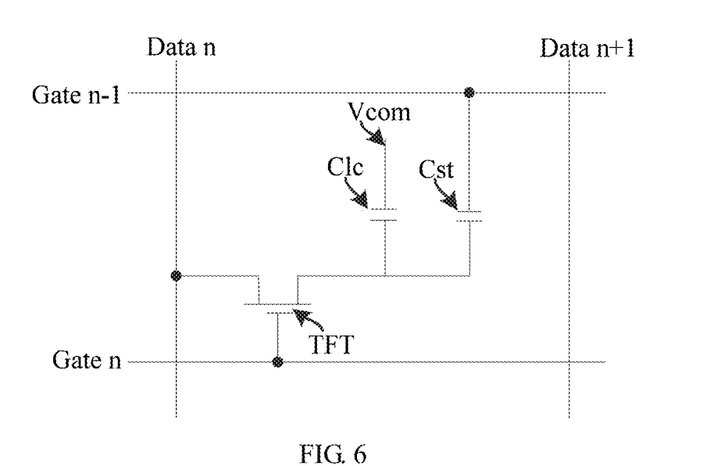
FIG. 6 is a circuit schematic view of a pixel structure of the disclosure.
Figure 7:
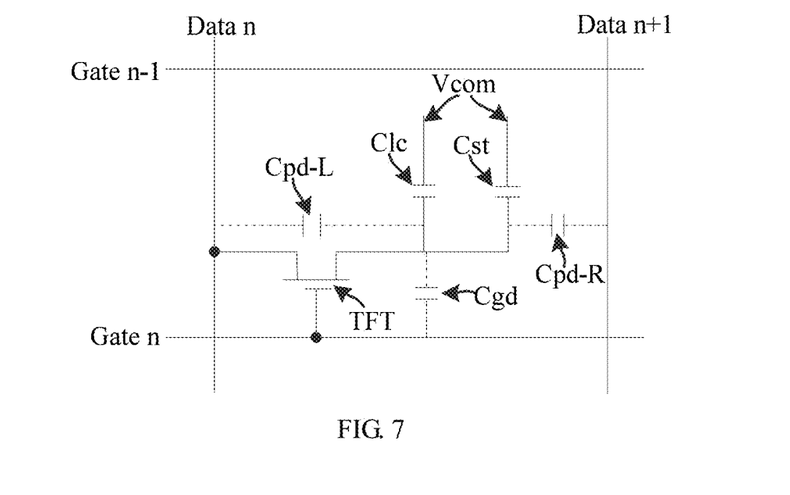
FIG. 7 is a circuit schematic view of a pixel structure of the disclosure.
Figure 8:
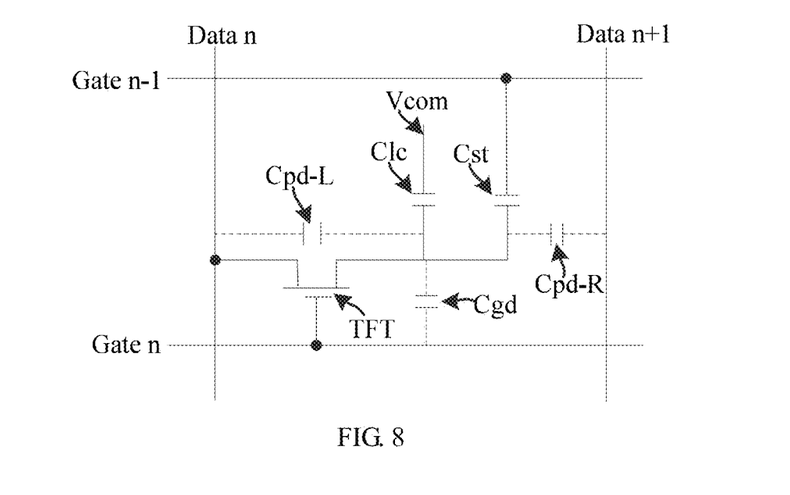
FIG. 8 is a circuit schematic view of a pixel structure of the disclosure.
Figure 9:
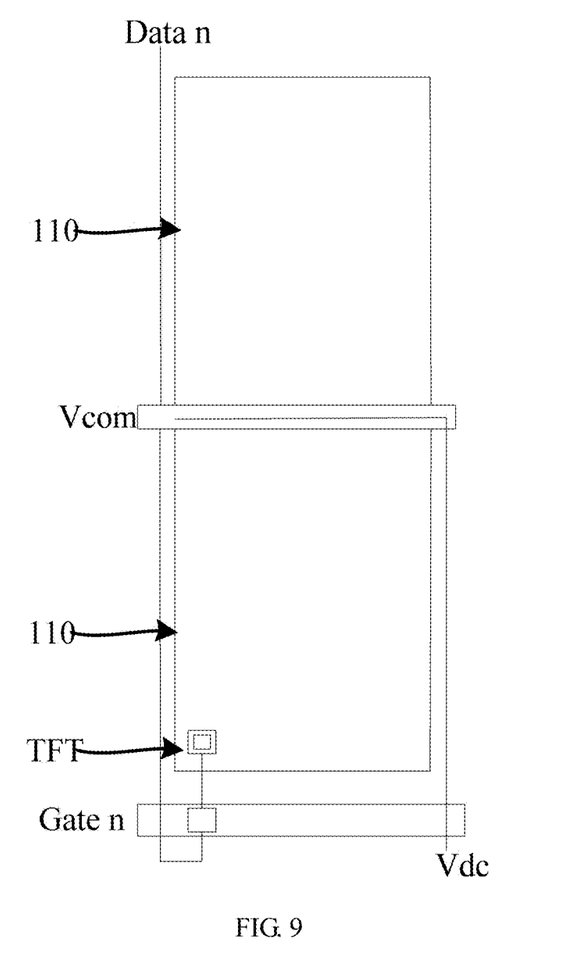
FIG. 9 is a structural schematic view of a pixel structure according to an embodiment of the disclosure.
Figure 10:
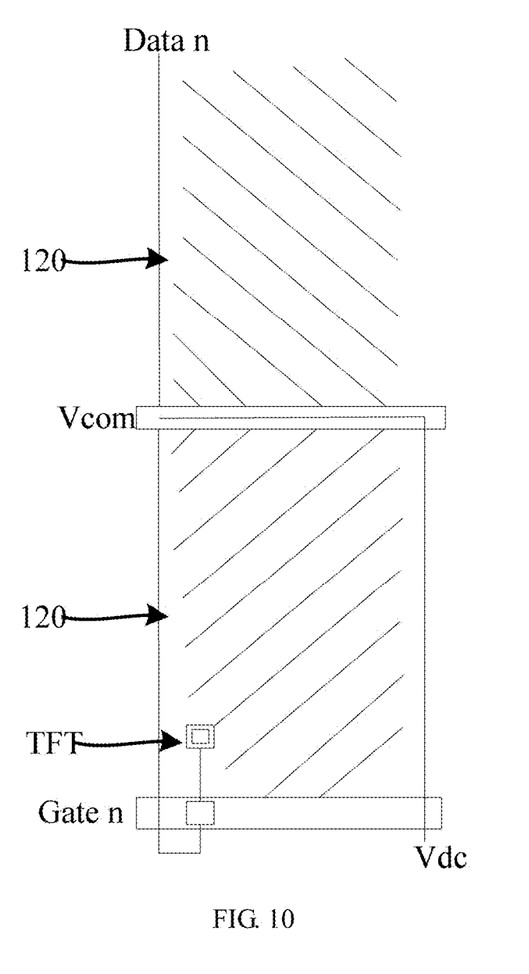
FIG. 10 is a structural schematic view of a pixel structure according to an embodiment of the disclosure.
Figure 11:
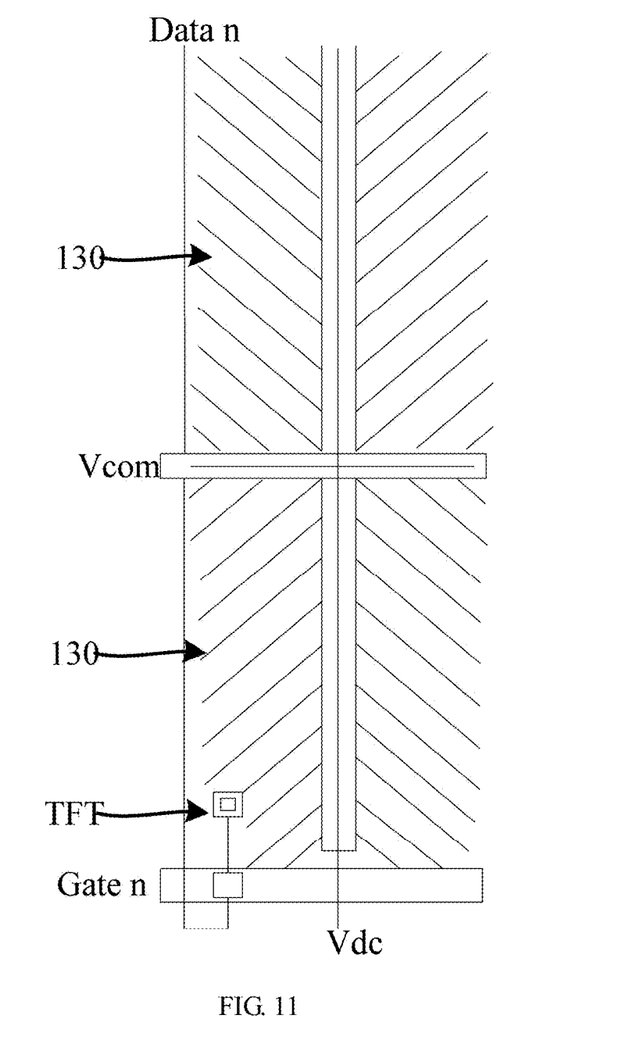
FIG. 11 is a structural schematic view of a pixel structure according to an embodiment of the disclosure.
Figure 12:
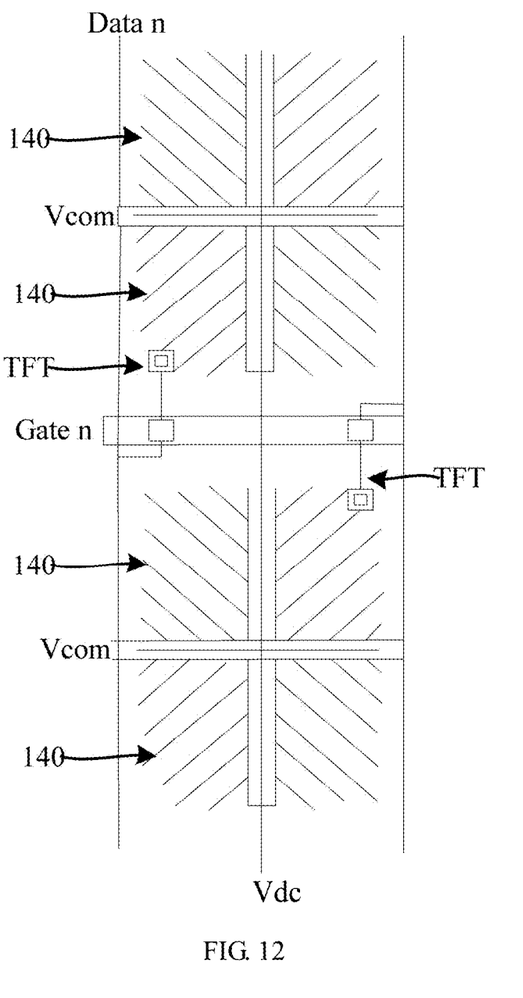
FIG. 12 is a structural schematic view of a pixel structure according to an embodiment of the disclosure.

Specifically, an embodiment of the pixel structure of the invention is show as four different pixel structures according to FIG. 9 to FIG. 12. It is not limited thereto. The pixel structure of this embodiment of the invention comprising a pixel electrode. FIG. 9 shows a pixel structure of the invention, the pixel structure includes a first pixel electrode 110. FIG. 10 shows another pixel structure of the invention, the pixel structure includes a second pixel electrode 120. FIG. 11 shows another further pixel structure of the invention; the pixel structure includes a third pixel electrode 130. FIG. 12 shows another further pixel structure of the invention; the pixel structure includes a fourth pixel electrode 140.

In an embodiment of the invention, the pixel structure including a first conducting layer 11, a second conducting layer 12 and a third conducting layer 13. Please refer to the FIG. 15 and FIG. 16. The first conducting layer 11 is coupled to a drain of the active switch TFT (not limited to the TFT). The second conducting layer 12 is coupled to a first voltage line. The third conducting layer 13 is coupled to a second voltage line. The first conducting layer 11, the second conducting layer 12 and the third conducting layer 13 are stacking to each other and disposed interval. The first conducting layer 11, the second conducting layer 12 and the third conducting layer 13 are overlapped to each other of the vertical space.

Compared to current technology, three of the conducting layers of the pixel structure in the embodiment could power up and forming two storage capacitors. Both of storage capacitors keep pixel voltage size of pixel structure at the same time for reducing affect of parasitic capacitances and improving crosstalk affect, and the display panel could be displayed properly.

In addition, compare to using a storage capacitor for keeping voltage size of the pixel structure as shown in FIG. 1 to FIG. 8, using two storage capacitors for keeping voltage size of the pixel structure in this embodiment could providing better efficiency and made stable voltage size of pixel structure. Also, the first conducting layer, the second conducting layer and the third conducting layer are stacked to each other directly in this embodiment. It do not increase the flat size of each conducting layers and also enhancing the capacitor of pixel structure, keeping voltage size of pixel structure better so that the pixel structure of this disclosure is more suitable for high resolution display panel.

In other embodiment, pixel structure has more conducting layers to form more storage capacitors in the pixel structure (for example, fourth storage capacitor, fifth storage capacitor).

Figure 16:
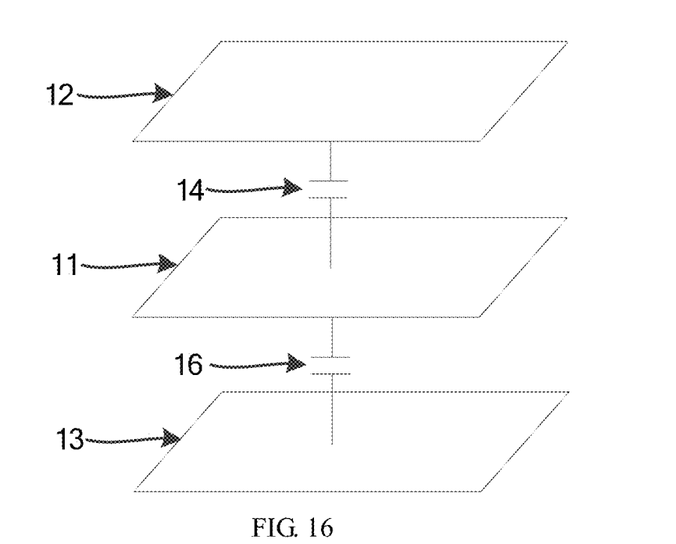
FIG. 16 is a structural schematic view of the first conducting layer, the second conducting layer and the third conducting layer are corresponding to each other according to an embodiment of the disclosure.

In an embodiment, as shown of the FIG. 16. FIG. 16 is an embodiment of the structure of stacking the first conducting layer, the second conducting layer and the third conducting layer of the invention. Specifically, the first conducting layer 11 is corresponding to the second conducting layer 12 and the third conducting layer 13, so that the first storage capacitor 14 is formed between the first conducting layer 11 and the second conducting layer 12. More precisely, the first conducting layer 11 is disposed between to the second conducting layer 12 and the third conducting layer 13. According to the FIG. 13 and FIG. 14, the first storage capacitor 14 is a storage capacitor Cst. The storage capacitor Cst is defined to the first storage capacitor 14 of the pixel structure in the FIG. 16. The second storage capacitor 16 is formed between the first conducting layer 11 and the third conducting layer 13. The second storage capacitor 16 is a storage capacitor Cnew. The storage capacitor Cnew is defined to the second storage capacitor 16 of the pixel structure in the FIG. 16. Both of storage capacitors (first storage capacitor 14 and second storage capacitor 16) keep electric potential of pixel structure voltage. So that voltage of pixel structure will not be affected by varying the charging voltage of the data line while charging process, and will be improves crosstalk effect.

Figure 13:
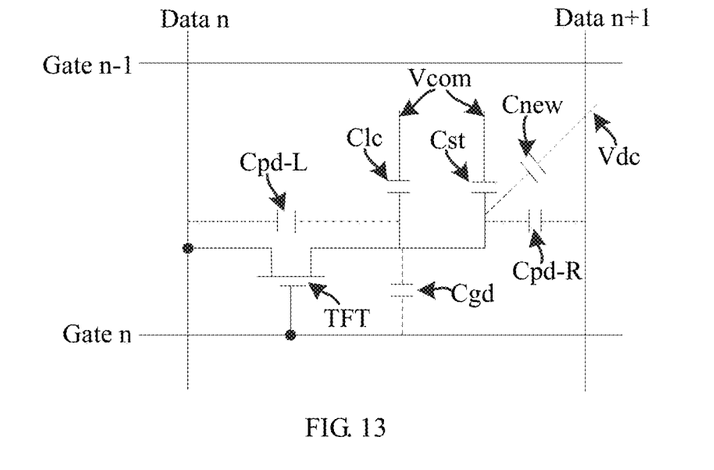
FIG. 13 is a circuit schematic view of a pixel structure according to an embodiment of the disclosure.
Figure 14:
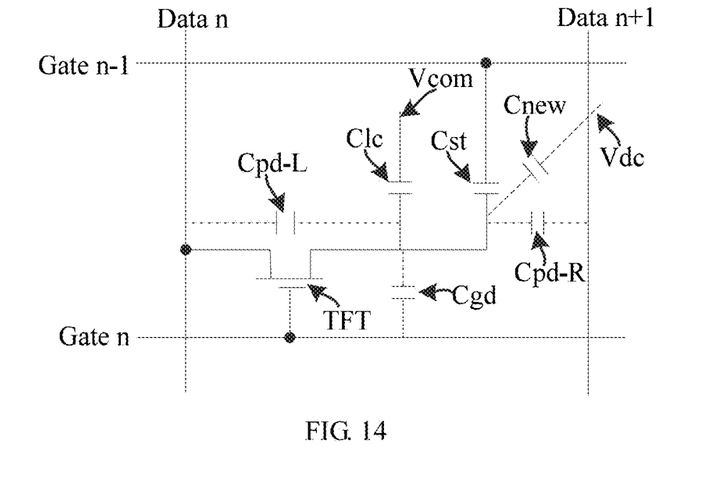
FIG. 14 is a circuit schematic view of a pixel structure according to an embodiment of the disclosure.
Figure 15:
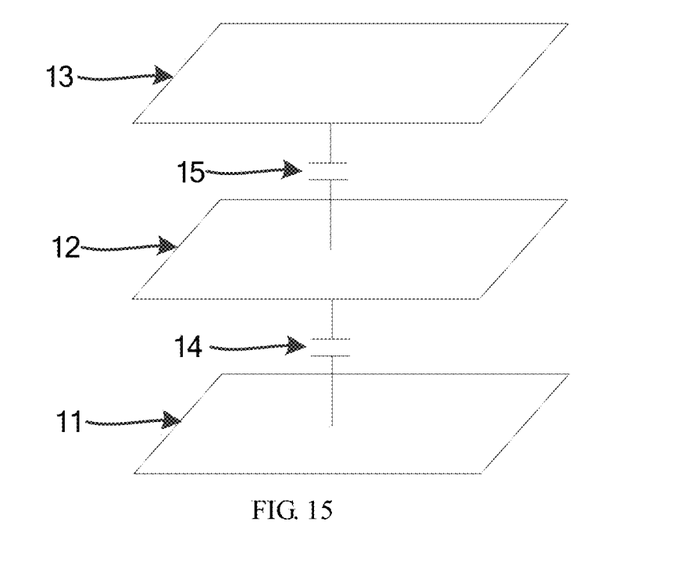
FIG. 15 is a structural schematic view of a first conducting layer, a second conducting layer and a third conducting layer are corresponding to each other according to an embodiment of the disclosure.

However, it is should be noted that FIG. 16 is one of embodiment shows conducting layer structure's distribution in the invention, but also probably to be other structure's distribution for example the structure shown as FIG. 15. FIG. 15 is a structural schematic view of the first conducting layer, the second conducting layer and the third conducting layer are corresponding to each other according to an embodiment of the disclosure. Specifically, the second conducting layer 12 is arranged between the first conducting layer 11 and the third conducting layer 13, so that a same storage capacitor as the FIG. 16 is formed between the first conducting layer 11 and the second conducting layer 12, which is the first storage capacitor 14. According to the FIG. 13 and FIG. 14, the first storage capacitor 14 is a storage capacitor Cst. The storage capacitor Cst is defined to the first storage capacitor 14 of the pixel structure in the FIG. 15. A third storage capacitor 15 is formed between the second conducting layer 12 and the third conducting layer 13. The third storage capacitor 15 is a storage capacitor Cnew. The storage capacitor Cnew is defined to the third storage capacitor 15 of the pixel structure in the FIG. 15. (However, it is should be noted FIG. 13 and FIG. 14 only for illustrating a new storage capacitor, which is the second storage capacitor or the third storage capacitor. So that the Cnew shown as FIG. 13 and FIG. 14 is only for describe to the second storage capacitor or the third storage capacitor, but the second storage capacitor and the third storage capacitor is not the same and respectively shown in FIG. 15 and FIG. 16) Both of storage capacitors (first storage capacitor 14 and third storage capacitor 15) keep electric potential of pixel structure voltage. So that voltage of pixel structure will not be affected by varying the charging voltage of the data line while charging process, and will be improves crosstalk effect.

In this embodiment, the second storage capacitor and the third storage capacitor will replace to Cnew in below described.

Please refer to FIG. 13 and FIG. 14. The first conducting layer 11 is coupled to the active switch TFT. One side of the capacitor Clc is coupled to the common line Vcom. The capacitor Clc is coupled to the active switch TFT. TFT is respectively coupled to the data line Data n and the scan line Gate n. The data line charging the pixel structure by TFT whiles the scan line switch on the TFT. Specifically, the data line charging the liquid crystal capacitor Clc and two of storage capacitors (Cst and Cnew, which respectively indicates the first storage capacitor and the second storage capacitor as shown in FIG. 16; or respectively indicates the first storage capacitor and the third storage capacitor as shown in FIG. 15).

Further, the first voltage line includes an upper scan line Gate n−1 as shown in FIG. 14 which indicated the second conducting layer 12 is coupled with the upper scan line. The charging process of the pixel structure is the scan line Gate n controls and switch-on the active switch TFT so that the data line Data n charging the pixel structure. The upper scan line is an upper line of the scan line, and the upper scan line pre-charging the second conducting layer 12 so that having voltage thereof. It could reduce the charging time while charging the scan line and achieve to predetermined potential of the second conducting layer 12 fast. This is a specifically embodiment for the second conducting layer coupled to the first voltage line. However, it is should noted that, the second conducting layer could be coupled to another first electrode voltage line such as shown in FIG. 13, the first voltage line includes common line Vcom which indicated the second conducting layer 12 is coupled to the common line Vcom and the common line Vcom charging the second conducting layer. It could provide a simple structure.

In this embodiment, the third conducting layer 13 is coupled with the second voltage line as FIG. 9 to FIG. 14. The second voltage line Vdc of the embodiment in this invention is coupled to a DC voltage, and the common line which is connected to the second conducting layer has voltage range for example 7.5V or 0V; voltage range of the data line is −5~15V; voltage range of the scan line −6~35V. Therefore the third conducting layer which connected to the second voltage line has different voltage to the first conducting layer and the second conducting layer so that forming storage capacitors between the third conducting layer and the first conducting layer or the third conducting layer and the second conducting layer.

In the embodiment as shown in FIG. 9 to FIG. 12 of the invention, the manufacture method of the pixel structure can include: forming a first conducting layer 11 on the substrate (not shown, for example transparent substrate of active array substrate); forming a second conducting layer 12 on the substrate; forming a third conducting layer 13 on the substrate, the first conducting layer 11, the second conducting layer 12 and the third conducting layer 13 are stacked to each other and arranged interval, and the first conducting layer 11, the second conducting layer 12 and the third conducting layer 13 are overlapped to each other of the vertical space; and forming active switch TFT in the pixel region after the first conducting layer is be formed, the first conducting layer 11 is coupled to a drain of the active switch TFT; the second conducting layer 12 is coupled to a first voltage line; the third conducting layer 13 is coupled to a second voltage line.

In this embodiment, the scan line Gate is also formed on the substrate during the first conducting layer 11 is formed. For example, the scan line Gate and the common line Vcom could be formed in the same mask process shown as FIG. 9 to FIG. 12, and at least part of the common line Vcom could be the first conducting layer 11.

In some embodiment, the pixel electrode 110, 120, 130, 140 is formed on the substrate while the second conducting layer 12 is formed. For example, at least part of the pixel electrode 110, 120, 130, 140 could use to be the second conducting layer 12. The pixel electrode 110, 120, 130, 140 is made of the following material such as ITO, IZO, AZO, ATO, GZO, TCO, ZnO or poly(3,4-ethylenedioxythiophene)(PEDOT).

In some embodiment, when the third conducting layer 13 is formed, the third conducting layer 13 is made of the same material of a first metal layer or a second metal layer of the active switch TFT. For example, the third conducting layer 13 is made of the same material as the second metal layer (source, drain) of the active switch TFT shown as the FIG. 9 to FIG. 12.

In some embodiment, at least one of the first conducting layer 11, the second conducting layer 12 and the third conducting layer 13 is made of same material as the first metal layer of the active switch TFT such as Al, Ag, Cu, Mo, Cr, W, Ta, Ti, nitride metal or a alloy composite material of the above described, also could be a multi-layer structures which have a heat resistant metal film and a low resistivity film, for example a double-layer structures made by molybdenum-nitride film and aluminum film.

In some embodiment, at least one of the first conducting layer 11, the second conducting layer 12 and the third conducting layer 13 is made of same material as the second metal layer of the active switch TFT such as Mo, Cr, Ta, Ti or an alloy composite material of the above described.

In some embodiment, at least one of the first conducting layer 11, the second conducting layer 12 and the third conducting layer 13 is made of transparent conductive material such as ITO, IZO, AZO, ATO, GZO, TCO, ZnO or poly(3,4-ethylenedioxythiophene)(PEDOT).

In this embodiment, the circuit structure of the pixel as shown in FIG. 13 and FIG. 14 includes: a data line Data; a scan line Gate and the data line Data corresponding to define a pixel region; an active switch TFT is coupled with the data line Data and the scan line Gate; a liquid crystal capacitor Clc is coupled with the active switch TFT; a first storage capacitor Cst is coupled with the active switch TFT; and a second storage capacitor Cnew is coupled with the first storage capacitor Cst and a DC voltage Vdc.

In this embodiment as shown in FIG. 13. One side of the first storage capacitor Cst is coupled to the active switch TFT, another side of the first storage capacitor Cst is coupled to the common line Vcom.

In this embodiment as shown in FIG. 14. One side of the first storage capacitor Cst is coupled to the active switch TFT, another side of the first storage capacitor Cst is coupled to one of the scan line Gate (for example upper-scan line Gate n−1).

In some embodiment, the first storage capacitor Cst and the second storage capacitor Cnew is formed by the first conducting layer, the second conducting layer and the third conducting layer. The first conducting layer is couple to drain of the active switch. The second conducting layer is coupled to a first voltage line. The third conducting layer is coupled to a second voltage line. The first conducting layer, the second conducting layer and the third conducting layer are stacked to each other and interval arrange. The first conducting layer, the second conducting layer and the third conducting layer are overlapped to each other of the vertical space.

In some embodiment, the first voltage line includes a common line Vcom.

In some embodiment, the second voltage line is overlap with the common line of the first conducting layer covering area.

In some embodiment, the first voltage line includes an upper scan line Gate n−1.

In some embodiment, the first conducting layer 11, the second conducting layer 12 and the third conducting layer 13 are respectively made of conductive metal. A specifically structure of the first conducting layer, the second conducting layer and the third conducting layer in this embodiment of the invention, three of the conducting layer (the first conducting layer 11, the second conducting layer 12 and the third conducting layer 13) are made of conductive metal which could provide good conductive efficiency. The conductive metal could be Al, Mo, Cu, Ti, Ag or an alloy composite material of the above described.

It is should be noted that, three of conducting layer (first conducting layer 11, second conducting layer 12 and third conducting layer 13) are made by conductive metal or other conductive material is one of example in the invention, there also have other embodiments as following described.

Illustration 1, the first conducting layer 11 and the second conducting layer 12 are respectively made of conductive metal, and the third conducting layer 13 is made of transparent conductive material. It is an specifically structure of the first conducting layer 11, the second conducting layer 12 and the third conducting layer 13 of an embodiment in the invention. The first conducting layer 11 and the second conducting layer 12 are made of conductive metal could provide good conductive efficiency. The third conducting layer 13 is made by the transparent conductive material and also could provide conductive efficiency, the transparent conductive material is such as ITO, IZO, AZO, ATO, GZO, TCO, ZnO or poly(3,4-ethylenedioxythiophene)(PEDOT).

Illustration 2, the first conducting layer 11 is made of conductive metal, and the second conducting layer 12 and the third conducting layer 13 are respectively made of transparent conductive material. It is an specifically structure of the first conducting layer 11, the second conducting layer 12 and the third conducting layer 13 of another embodiment in the invention. The first conducting layer 11 is made of conductive metal could provide good conductive efficiency. The second conducting layer 12 and the third conducting layer 13 are made by the transparent conductive material and also could provide conductive efficiency In this embodiment of the present invention as shown in FIG. 9 to FIG. 12. The second voltage wire Vdc and the common line Vcom are partially overlapped on space. Specifically, the second voltage line is overlap with the common line of the first conducting layer covering area. If both or multiple conducting wires are disposed side by side, there will having parasitic capacitances between the conducting wires and causing interference. The common line Vcom and the second voltage line Vdc are partially overlapped on space for enhancing anti-interference.

Furthermore, three of the conducting layer (first conducting layer 11, second conducting layer 12 and third conducting layer 13) are parallel to each other of this embodiment. This arrangement could save more flat space and providing a better efficiency pixel structure applied to display panel.

Figure 17:
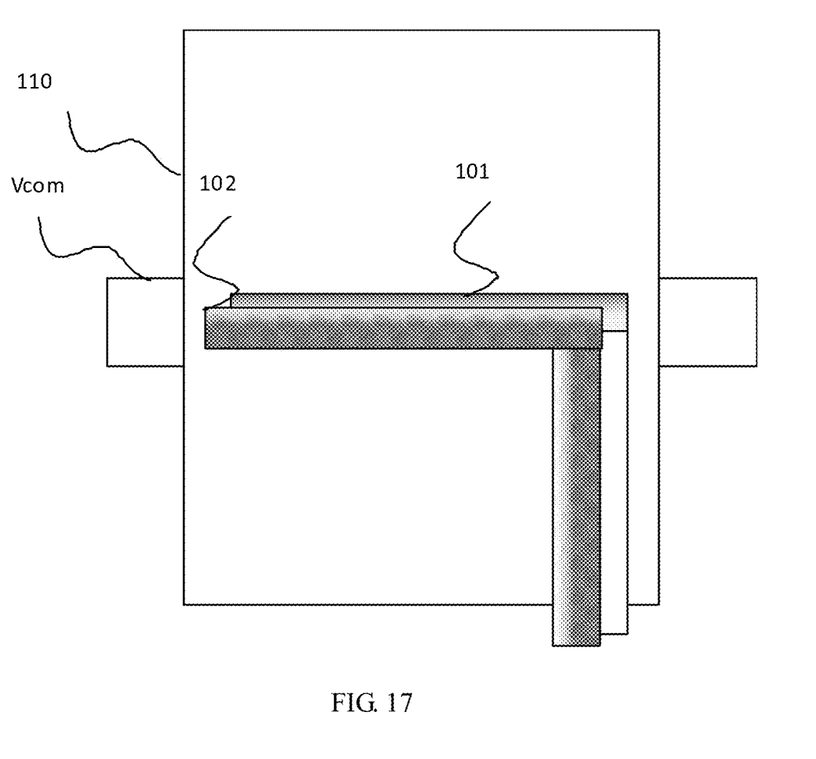
FIG. 17 is a structural schematic view of first conducting layer, the second conducting layer, the third conducting layer and a fourth conducting layer are corresponding to each other according to an embodiment of the disclosure.

A pixel structure of the invention as shown in FIG. 9, FIG. 10 and FIG. 17, includes: a pixel electrode 110, an active switch coupled to the pixel electrode 110, a common line in conjunction with the pixel electrode to from a first storage capacitor; and a second storage capacitor formed between a L-shaped conductive wire 101 and pixel electrode 110.

In an embodiment as shown in FIG. 17. Pixel structure further comprises a fourth conducting layer 102 (second L-shaped conducting wire) which is L-shaped, and the fourth conducting layer is overlapped on the third conducting layer 101 (first L-shaped conducting wire) which is L-shaped. An insulating layer at positions corresponding to the fourth conducting layer 102 (the second L-shaped conductive wire) and third conducting layer 101 (the first L-shaped conductive wire), and forming a third storage capacitor between the fourth conducting layer 102 (the second L-shaped conductive wire) and third conducting layer 101 (the first L-shaped conductive wire). More specifically, the insulating layer is arranged between the fourth conducting layer 102 (the second L-shaped conductive wire) and third conducting layer 101 (the first L-shaped conductive wire).

According to another embodiment of the disclosure, the disclosure further provides an array substrate. The array substrate includes a common line, a data line and a scan line. The array substrate further includes a pixel structure. The pixel structure is respectively coupled with the data line and scan line. The structure of the common line, the data line, the scan line and the pixel structure of this embodiment as described to other embodiments above. Or the structure, arrangement, connected relation of the common line, the data line, the scan line and the pixel structure of this embodiment as shown in FIG. 9 to FIG. 17. The array substrate includes multiple pixel structures of this embodiment, each of the pixel structure is shown in FIG. 9 to FIG. 17 will not be described again.

According to another embodiment of the disclosure, the disclosure further provides a display panel. The display panel includes a color filter (CF) substrate and an array substrate. The array substrate includes a common line, a data line and a scan line. The array substrate further includes a pixel structure, and the pixel structure is respectively coupled with the data line and scan line. The structure of the common line, the data line, the scan line and the pixel structure of this embodiment as described to other embodiments above. Or the structure, arrangement, connected relation of the common line, the data line, the scan line and the pixel structure of this embodiment as shown in FIG. 9 to FIG. 17. The array substrate includes multiple pixel structures of this embodiment, each of the pixel structure is shown in FIG. 9 to FIG. 17 will not be described again.

According to another embodiment of the disclosure, the disclosure further provides a display device. The display device includes a display panel and a back-light module. The display panel includes a color filter (CF) substrate and an array substrate. The array substrate includes a common line, a data line and a scan line. The array substrate further includes a pixel structure, and the pixel structure is respectively coupled with the data line and scan line. The structure of the common line, the data line, the scan line and the pixel structure of this embodiment as described to other embodiments above. Or the structure, arrangement, connected relation of the common line, the data line, the scan line and the pixel structure of this embodiment as shown in FIG. 9 to FIG. 16. The array substrate includes multiple pixel structures of this embodiment, each of the pixel structure is shown in FIG. 9 to FIG. 16 will not be described again. The display device could be liquid crystal display device or other display devices, the back-light module could be light source for providing adequate brightness and uniform light. The back-light module could be front light type or back light type. It is should be noted that the back light module of this embodiment is not limited thereto.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A pixel structure, comprising
a pixel electrode,
an active switch coupled to the pixel electrode,
a common line in conjunction with the pixel electrode to form a first storage capacitor; and
a L-shaped conductive wire in conjunction with the pixel electrode to form a second storage capacitor, and the L-shaped conductive wire comprises a first L-shaped conductive wire;
wherein the first storage capacitor and the second storage capacitor are further formed by a first conducting layer, a second conducting layer and a third conducting layer, the first conducting layer is coupled to a drain of the active switch, the second conducting layer is coupled to a first voltage line, the L-shaped conductive wire is formed by the third conducting layer coupled to a second voltage line, and the first conducting layer, the second conducting layer and the third conducting layer are stacked interval, and the first conducting layer, the second conducting layer and the third conducting layer are overlapped to each other, the second voltage line is coupled to a DC voltage;
the pixel structure further comprises a second L-shaped conductive wire overlapped on the first L-shaped conductive wire, and an insulating layer at positions corresponding to the first L-shaped conductive wire and the second L-shaped conductive wire for forming a third storage capacitor different from the second storage capacitor.

2. The pixel structure according to claim 1, wherein an end of the first storage capacitor is coupled to the active switch and another end of the first storage capacitor is coupled to one of scan lines.

3. The pixel structure according to claim 1, wherein the first voltage line comprises the common line.

4. The pixel structure according to claim 1, wherein the second voltage line is overlap with the common line of the first conducting layer covering area.

5. The pixel structure according to claim 1, wherein the first voltage line comprises a scan line.

6. The pixel structure according to claim 1, wherein at least one of the first conducting layer, the second conducting layer and the third conducting layer is made of transparent conductive material.

7. The pixel structure according to claim 1, wherein the first conducting layer is corresponding to the second conducting layer and the third conducting layer, and the first storage capacitor is formed between the first conducting layer and the second conducting layer, and the second storage capacitor is formed between the first conducting layer and the third conducting layer.

8. The pixel structure according to claim 1, wherein the pixel electrode is made of transparent conductive material.

9. The pixel structure according to claim 1, wherein the active switch is thin-film transistor and at least one of the first conducting layer, the second conducting layer and the third conducting layer is made by same material of a metal layer of the active switch.

10. The pixel structure according to claim 1, wherein the first conducting layer, the second conducting layer and the third conducting layer are made of conductive metal.

11. The pixel structure according to claim 1, wherein the first conducting layer, the second conducting layer and the third conducting layer are parallel to each other.

12. A pixel structure comprising
a pixel electrode,
an active switch coupled to the pixel electrode,
a common line in conjunction with the pixel electrode to form a first storage capacitor; and
a L-shaped conductive wire in conjunction with the pixel electrode to form a second storage capacitor, and the L-shaped conductive wire comprises a first L-shaped conductive wire;
wherein the first storage capacitor and the second storage capacitor are further formed by a first conducting layer, a second conducting layer and a third conducting layer, the first conducting layer is coupled to a drain of the active switch, the second conducting layer is coupled to a first voltage line, the third conducting layer is coupled to a second voltage line, and the first conducting layer, the second conducting layer and the third conducting layer are stacked interval, and the first conducting layer, the second conducting layer and the third conducting layer are overlapped to each other;
wherein the first voltage line comprises the common line and a scan line, the second voltage line is coupled to a DC voltage;
wherein the pixel structure further comprises a second L-shaped conductive wire overlapped on the first L-shaped conductive wire, and an insulating layer at positions corresponding to the first L-shaped conductive wire and the second L-shaped conductive wire for forming a third storage capacitor different from the second storage capacitor.

* * * * *